United States Patent [19]
Peckham et al.

[11] Patent Number: 6,049,704
[45] Date of Patent: Apr. 11, 2000

[54] APPARATUS FOR AMPLIFYING AN RF SIGNAL

[75] Inventors: David S. Peckham, Barrington Hills; Michael F. Landherr, Cary; Armin W. Klomsdorf, Spring Grove; Mark A. Pennock, Lake Zurich, all of Ill.

[73] Assignee: Motorola, Inc., Schaumburg, Ill.

[21] Appl. No.: 08/988,490

[22] Filed: Dec. 10, 1997

[51] Int. Cl.[7] .................................................. H03G 3/30
[52] U.S. Cl. .................. 455/232.1; 455/127; 330/285; 330/279
[58] Field of Search .......................... 455/232.1, 251.1, 455/245.1, 250.1, 253.2, 311, 341, 127; 330/128, 129, 133, 134, 277, 279, 285, 297

[56] References Cited

U.S. PATENT DOCUMENTS

| | | | |
|---|---|---|---|
| 5,029,298 | 7/1991 | Chiba et al. | 330/285 |
| 5,250,912 | 10/1993 | Fujita | 330/285 |
| 5,278,517 | 1/1994 | Fujita | 330/279 |
| 5,311,143 | 5/1994 | Soliday | 330/127 |
| 5,442,322 | 8/1995 | Kornfeld et al. | 330/285 |
| 5,589,796 | 12/1996 | Alberth, Jr. et al. | 330/133 |

OTHER PUBLICATIONS

Landherr et al., Method and Apparatus for Amplifying a Signal, Attorney Docket No. CE01603R, U.S.S.N. 08/890,819, filed Jul. 11, 1997.

*Primary Examiner*—William G. Trost
*Assistant Examiner*—Erika A Gary
*Attorney, Agent, or Firm*—Paul J. Bartusiak

[57] ABSTRACT

According to the apparatus of the present disclosure, dual gate control and dual gain control uses variable voltages on the gates of first stage (302) and a second stage (304) to control the output power. In alternate embodiments, dual drain control is also employed using a variable voltage supply on the drains of the first stage (302) and the second stage (304). In particular, a level shifter circuit (421) is employed to convert a positive voltage gate control signal to negative voltage with respect to ground. Drain current limiting circuits (417, 419) are used to sample drain currents and generate gate voltages to maintain a desired current ratio between stages of a multi-stage amplifier. When dual drain control is also employed, a 1:1 ratio of drain control voltages is employed at low power levels, with a single drain control at higher power levels.

27 Claims, 5 Drawing Sheets

APPARATUS FOR AMPLIFYING AN RF SIGNAL

FIELD OF THE INVENTION

This invention relates generally to amplifiers, and more particularly to a method and apparatus for the bias control of a multi-stage power amplifier.

BACKGROUND OF THE INVENTION

A power amplifier (PA) is used in a wireless communication device such as a cellular radiotelephone to amplify radio frequency (RF) signals in order to achieve a desired RF signal power for transmission to another communication device in the system. Considerable power in a wireless communication device is dissipated in the power amplifier. For example, in a cellular radiotelephone, a significant percent of the power dissipation is in the power amplifier. In portable communication systems, power consumption decreases the talk time and the standby time of a portable communication device before subsequent recharging of the battery used in the device is necessary.

Wireless communication devices typically transmit radio signals at a plurality of power levels. For example, some cellular telephone systems operate with the portable radiotelephone having in excess of 20 dB of control in the variation of the output power level of the transmit signal. Typically a portion of the power control is accomplished by controlling the RF gain of the power amplifier. The power control occurs in discrete steps or the power control is continuous over the range of control.

In a conventional two-stage FET power amplifier, the power control can be accomplished by varying the voltage supply on the first stage drain, while the gate-to-drain voltage ($V_{gs}$) of the second stage is kept substantially constant. This control configuration provides optimum efficiency for high output power levels. At lower output power levels, the amplifier current drains remain high, and the efficiency of the power thus decreases.

One method to improve the efficiency of a power amplifier involves varying the gate voltage of the FET as the RF output power changes. At lower RF output power levels, the gate voltage is made more negative, thereby reducing quiescent current and placing the FET in a more efficient operating point.

In one known reference of a previous application, the prior art discloses two methods that can be used to vary the gate bias voltage of a FET power amplifier to increase the efficiency as the power of the RF output signal varies.

The first method involves receiving a digital control word which reflects the level of the RF output power of the FET power amplifier. For low RF output levels, the digital control word is applied to a digital-to-analog (D/A) converter and the analog control signal produced by the D/A converter is applied to a driver amplifier. The output of the driver amplifier then adjusts the gate voltage of the FET to reduce the FET's current, thereby increasing the efficiency of the FET that would otherwise result if the FET current was kept constant during lower RF output power levels. For high RF output power levels, the digital control word, D/A converter, and driver amplifier causes the FET current to increase so that the FET can efficiently deliver the proper RF output power.

The second method involves the use of a resistor voltage divider with several tap points. The different tap points are applied to a selector or analog switch, and discrete voltages for application to a FET power amplifier's gate can be generated in response to a power control command word.

In a multi-stage FET power amplifier, the pinchoff voltage for the FET of each stage is usually different. This is because different sized devices are used, because devices from the same semiconductor wafer have varying pinchoff voltages, or devices from different semiconductor wafers are used. With the different pinchoff voltages comes the problem of non-optimum gate control for each stage. If nothing is done to account for the different pinch-off voltages, a gate control voltage could cause the drain current of a stage to be too high and therefore permanently damage the device. Alternatively, the varying pinchoff voltage could cause the drain current for a particular gate voltage to be too high and therefore degrade the efficiency of the power amplifier.

The problem can be fixed by individually calibrating the first and second stage currents at the factory, but this solution is a very time consuming and expensive process. A second alternative is to duplicate the control circuitry of first stage for the second stage. This would result, for example, in an extra D/A converter or an extra resistive voltage divider and switch combination, thereby increasing the size, complexity, and cost of the circuitry.

Accordingly, there is a need to develop an apparatus and method to control the gate voltages to compensate for the different pinchoff voltages of a multi-stage power amplifier comprising multiple field effect transistors. The result will be a lower cost solution, since each power amplifier will not have to be calibrated at the factory for pinchoff voltage variation. The new apparatus and method will also reduce cost by eliminating the need for redundant circuitry to develop separate gate control voltages to account for the different pinchoff voltages of each stage.

DETAILED DESCRIPTION OF A PREFERRED EMBODIMENT

The present invention advantageously provides an apparatus for separately controlling the gate voltages of a multi-stage FET power amplifier. Dual gate control advantageously provides the dynamic range of output power control of the power amplifier necessary for the transmission of both low and high power signal levels. Dual gate control also advantageously provides the ability to compensate for variations in the pinch-off voltage in each stage of a multi-stage FET amplifier, thereby reducing current consumption, improving amplifier efficiency, and avoiding amplifier degradation. The present invention further advantageously provides an apparatus for dual gate control which obviates the need for extra circuitry, such as digital-to-analog (D/A) converters or resistive voltage divider switches which, without the present invention, would otherwise be needed to obtain separate dual gate voltage control. The present invention further advantageously provides an apparatus for dual gate control in conjunction with dual drain control for further efficiency and power control improvement.

Figure 1:
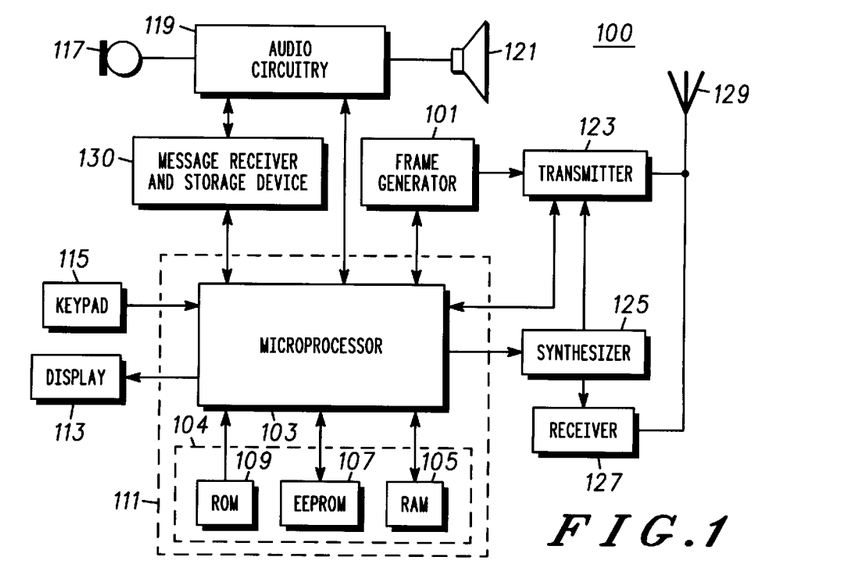
FIG. 1 is a block diagram of a wireless communication device, such as a cellular radio telephone, according to the present invention.

Turning first to FIG. 1, a block diagram of a wireless communication device such as a cellular radiotelephone incorporating the present invention is shown. In the preferred embodiment, a frame generator ASIC 101, such as a CMOS ASIC available from Motorola, Inc. and a microprocessor 103, such a s a 68HC11 microprocessor also available from Motorola, Inc., combine to generate the necessary communication protocol for operating in a cellular system. Microprocessor 103 uses memory 104 comprising RAM 105, EEPROM 107, and ROM 109, preferably consolidated in one package 111, to execute the steps necessary to generate the protocol and to perform other functions for the communication unit, such as writing to a display 113, accepting information from a keypad 115, controlling a frequency synthesizer 125, or performing steps necessary to amplify a signal according to the method of the present invention. Frame generator ASIC 101 processes audio transformed by audio circuitry 119 from a microphone 117 and to a speaker 121.

A transceiver processes the radio frequency signals. In particular, a transmitter 123 transmits through an antenna 129 using carrier frequencies produced by a frequency synthesizer 125. Information received by the communication device's antenna 129 enters receiver 127 which demodulates the symbols comprising the message frame using the carrier frequencies from frequency synthesizer 125. The communication device optionally includes a message receiver and storage device 130 including digital signal processing means. The message receiver and storage device could be, for example, a digital answering machine or a paging receiver.

Figure 2:
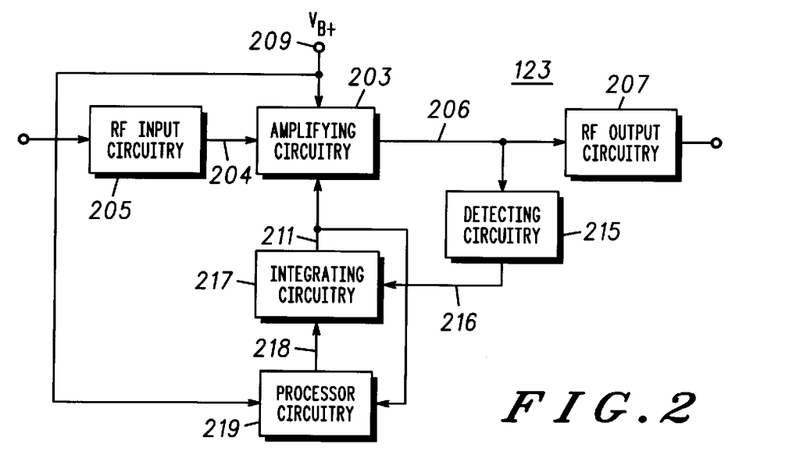
FIG. 2 is a block diagram of a transmitter circuit 123 of the block diagram of FIG. 1.

Turning now to FIG. 2, a block diagram illustrates the transmitter 123 having amplifying circuitry 203 and corresponding control circuitry comprising detecting circuitry 215, integrating circuitry 217, and processor circuitry 219. Amplifying circuitry 203 preferably contains two gallium arsenide FET (Field Effect Transistor) amplifying elements to receive an input signal and generate an output signal which is an amplified version of the input signal. A power source 209, such as a battery, generates a battery voltage signal denoted by $V_{B+}$ and supplies power to the amplifying circuitry 203. Although the battery comprising the power source 209 normally is fabricated to provide a particular battery voltage signal, such as 3.0 volts, 4.8 volts, or 6.0 volts. When nominally charged, however, the amplifying circuitry 203 must be capable of functioning when the battery has significantly discharged to a voltage lower than the particular voltage.

Amplifying circuitry 203 amplifies an RF input signal 204 (typically containing voice and data to be transmitted) provided by RF input circuitry 205 into an amplified RF output signal 206. The RF input signal 204 is amplified such that the amount of power in the RF output signal 206 corresponds to one of a plurality of predetermined power output levels which define the operation of the transmitter 123. The amplifying circuitry 203 subsequently outputs the RF output signal 206 to RF output circuitry 207, which could be, for example, a duplex filter.

The block diagram of FIG. 2 contains an output power control loop to maximize the efficiency of the amplifying circuitry 203. The power control loop is generally controlled by processor circuitry 219. Although transmitter 123 utilizes the integral processor circuitry 219, the processor-dependent functionality of the transmitter 123 could be solely provided by a central processor for the device, such as microprocessor 103 shown in FIG. 1.

The output power control loop maintains the amount of power in the RF output signal 206 at a constant level by varying the gain of amplification of the amplifying circuitry 203 via an amplifier control signal 211. The output power control loop consists of detecting circuitry 215, processor circuitry 219, and integrating circuitry 217, and functions while transmitter 123 is in operation.

Detecting circuitry 215 is coupled between the amplifying circuitry 203 and RF output circuitry 207 as well as to the integrating circuitry 217 to detect the power level of the RF output signal 206. Upon detection, the detecting circuitry 215 generates and outputs a detected power output signal 216 to the integrating circuitry 217. The detected power output signal 216 corresponds to the amount of power in the RF output signal 206.

Processor circuitry 219 is coupled to the integrating circuitry 217 to provide a power output control signal 218. The power output control signal 218 contains a predetermined value defining the amount of power that should be in the RF output signal 206. The predetermined value is one of a plurality of phasing values stored in a memory of the processor circuitry 219 during manufacture.

Integrating circuitry 217 compares the detected power output signal 216 and power output control signal 218 to ensure that the amount of power in RF output signal 206 is correct. Integrating circuitry 217 accordingly adjusts the magnitude of amplifier control signal 211 to ensure that amplifying circuitry 203 provides an accurate and constant RF output signal 206.

Figure 3:
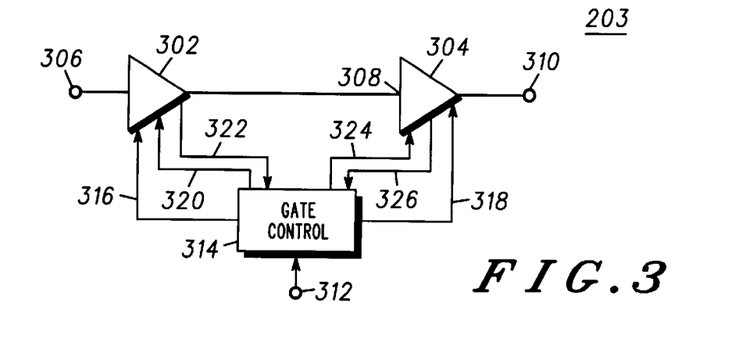
FIG. 3 is a block diagram of amplifying circuitry 203 according to the present invention.

Turning now to FIG. 3, a block diagram shows the amplifying circuitry 203 in more detail. In particular, amplifying circuitry 203 includes a first stage amplifier 302 and a second stage amplifier 304 for amplifying a signal from RF input circuitry 205. The RF input circuitry 205 typically comprises a conventional quadrature modulator, variable gain amplifiers, buffer amplifiers, filters, and mixers. First stage amplifier 302 receives an input signal at input 306 and generates a first output signal that is coupled to input 308 of the second stage amplifier 304. The output of the second stage amplifier 304 is produced at amplifier output 310. The first stage amplifier 302 and second stage amplifier 304 each receive a first and second gate control voltage, 316 and 318, respectively.

Although the gate voltages could be applied directly to the amplifier from a control circuit such as a microprocessor, amplifying circuitry 203 also preferably includes gate control circuitry 314. The gate control circuitry 314 receives a power control signal at an input 312. Gate control circuitry 314 generates first and second gate control voltages, 316 and 318, respectively. Gate control circuitry 314 also samples the drain current of the first stage amplifier 302 on lines 322 and 320 and samples the drain current of the second stage amplifier 304 on lines 326 and 324. As will be described in more detail in the next figure, the two gate control voltages are used to vary the output power, reduce the current, and maximize efficiency of amplifying circuitry 203.

Figure 4:
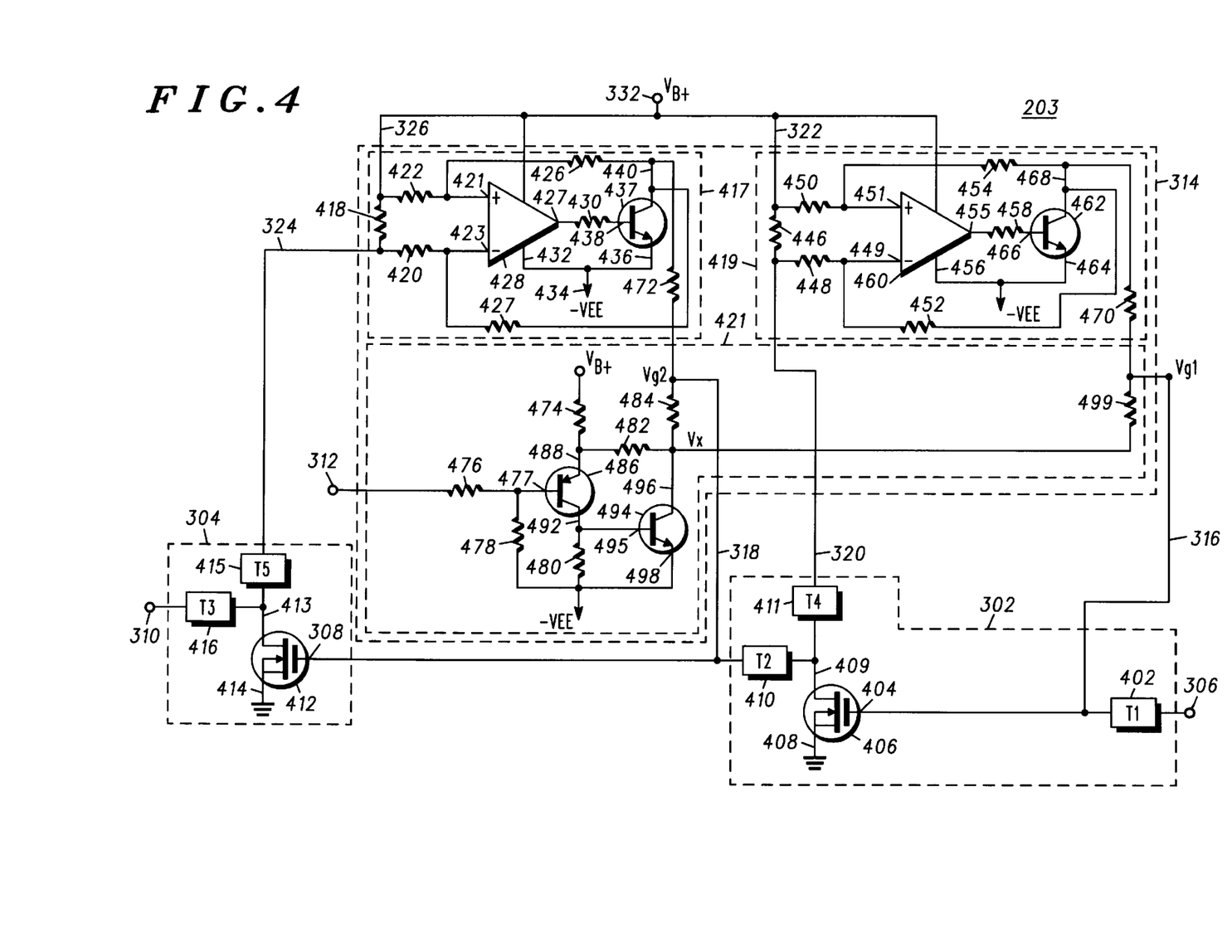
FIG. 4 is a more detailed circuit diagram of amplifying circuitry 203.

Turning now to FIG. 4, a circuit diagram of the amplifying circuitry 203 is shown. In particular, an input RF signal is applied to input 306 and coupled by input matching network 402 to a first power amplifier transistor 406. The input signal is coupled to first power amplifier transistor 406 at it's first input, here gate 404. The drain (alternatively referred to as a first output) of the first power amplifier transistor 406 is then coupled by interstage matching network 410 to a second input, here gate 308 of a second power amplifier transistor 412. Drain 409 and drain 413 generate an amplified RF signal. First power amplifier transistor 406 and second power amplifier 412 perferably comprise N-channel depletion type field effect transistors, but other devices could be incorporated according to the present invention.

The first power amplifier transistor 406 is responsive to a first gate control voltage (or alternatively a first current control voltage) for adjusting a first drain current (or alternatively a first current) of the first power amplifier transistor 406. A first drain matching network 411 couples the drain 409 of the first power amplifier transistor 406 to line 320. The source and substrate 408 of the first power transistor 406 and the source and substrate 414 of the second power amplifier transistor 412 are coupled to ground.

The second power amplifier transistor 412 is responsive to a second gate control voltage (or alternatively a second current control voltage) for adjusting a second drain current (or alternatively a second current) of the second power amplifier transistor 412. The second output, here drain 413 of the second power amplifier transistor 412, generates an output RF signal that is coupled through output matching network 416 to amplifier output 310. A second drain matching network 415 of the second power amplifier transistor 412 couples the drain 413 to line 324. Input matching network 402, interstage matching network 410, first drain matching network 411, second drain matching network 415, and output matching network 416 comprise conventional capacitors, inductors, and transmission lines.

Gate control circuitry 314 is also shown in more detail in FIG. 4 and generally comprises a level shifting circuit 421, a first current limiter, here first drain current limiter 419, and a second current limiter, here second drain current limiter 417.

Level shifting circuit 421 receives a current control signal, shown here as a gate control signal, at input 312 that is coupled by bias resistor 476 to a first level shift transistor 486 at base 477. First level shift transistor 486 produces a first level shift current. The first level shift transistor 486 is preferably a PNP transistor. The battery voltage $V_{B+}$ applied at supply port 332 is coupled through resistor 474 to the collector 488 of the first level shift transistor 486. The emitter 492 of first level shift transistor 486 is coupled through level shift resistor 480 to negative terminal 434, which is labeled −VEE. Bias resistor 478 couples the base 477 of first level shift transistor 486 to the negative terminal 434. The voltage applied to negative terminal 434 is preferably −5 Volts, but other voltages will suffice. The collector 492 of first level shift transistor 486 is coupled to base 495 of second level shift transistor 494. The second level shift transistor 494 is preferably an NPN transistor. The emitter 498 of second level shift transistor 494 is coupled to negative terminal 434. The emitter 488 of first level shift transistor 486 is coupled through resistor 482 to collector 496 of second level shift transistor 494. A first voltage divider resistor 499 of first drain current limiter 419 is coupled to collector 496 of second level shift transistor 494. A first voltage divider resistor 484 of second drain current limiter 417 is also coupled to collector 496 of second level shift transistor 494. The node where first voltage divider resistors 499 and 484 are coupled to collector 496 is labeled $V_x$.

The first drain current limiter 419 generally comprises a first current sampling resistor 446 which is coupled by line 322 to the battery voltage of supply port 332. First sampling resistor 446 couples the battery voltage to the first drain matching network 411, and first drain matching network 411 couples the battery voltage to drain 409 of first stage power transistor 406. The resistance of first current sampling resistor 446 is preferably less than five ohms.

A first isolation resistor 450 and a second isolation resistor 448 couples a first sampling voltage developed across first current sampling resistor 446 to a positive input 451 and a negative input 449 of a first op-amp 460. A first op-amp output voltage produced at the output 455 of first op-amp 460 is coupled through resistor 458 to a base 466 of a first open-collector transistor 462 to produce a first collector current. The first open-collector transistor 462 is preferably an NPN transistor. The collector 468 of the first open-collector transistor 462 is coupled through feedback resistor 454 to the positive input 451 of the first op-amp 460 for stability. The collector 468 of the first open-collector transistor 462 is also coupled through a feedback resistor 452 to the negative input 449 of the first op-amp 460 for stability and balance. The negative supply terminal 456 of first op-amp 460 is coupled to negative terminal 434, and the emitter 464 of first buffer transistor 462 is also coupled to negative terminal 434. The third voltage divider resistor 470, alternatively referred to as first current limiter voltage divider resistor, produces a first voltage drop and couples the collector 468 of first open-collector transistor 462 to the first voltage divider resistor 499 of the level shifting circuit 421.

The first current control voltage, here gate control voltage "$V_{g1}$", is formed at the connection of first and third voltage divider resistors, 499 and 470 respectively. The connection between the first and third voltage divider resistors, 499 and 470 respectively, is also referred to as the first current control voltage node. Line 316 couples the gate control voltage $V_{g1}$ to gate 404 of first power amplifier transistor 406. In an alternate embodiment, the first op-amp 428 comprises the first open collector transistor as a first op-amp output stage. In an alternate embodiment, the first op-amp 460 comprises the first open collector transistor 462 as a first op-amp output stage.

Similarly, the second drain current limiter 417 generally comprises a second current sampling resistor 418, for producing a second sampling voltage, is coupled by line 326 to the battery voltage of supply port 332. Second current sampling resistor 418 couples the battery voltage to the second drain matching network 415, and the second drain matching network 415 couples the battery voltage to drain 413 of second power amplifier transistor 412. The resistance of the second current sampling resistor 418 is typically less than one ohm. The second current sampling resistor 418 is also preferably selected to be a value such that there is a desired ratio between first current sampling resistor 446 and second current sampling resistor 418. Preferably, the value of the second current sampling resistor 418 is smaller than first current sampling resistor 446.

A first isolation resistor 422 and isolation resistor 420 couples the voltage developed across second current sampling resistor 418 to the positive input 421 and negative input 423, respectively, of second op-amp 428. A second op-amp output voltage produced at the output 427 of the second op-amp 428 is coupled through resistor 430 to a base 438 of a second open-collector transistor 437 to produce a second collector current. The second open-collector transistor 437 is preferably an NPN transistor. The collector 440 of the second buffer transistor 437 is coupled through feedback resistor 426 to the positive input 421 of second op-amp 428 for stability. The collector 440 of the second buffer transistor 437 is also coupled through feedback resistor 424 to the negative input 423 of second op-amp 428 for stability and balance. The negative supply terminal 432 of second op-amp 428 is coupled to negative terminal 434, and emitter 436 of second buffer transistor 437 is also coupled to negative terminal 434. The fourth voltage divider resistor 472, which is also referred to as second current limiter voltage divider resistor, produces a second voltage drop. The fourth voltage divider resistor 472 couples the collector 440 of second open-collector transistor 437 to the second voltage divider resistor 484 of the level shifting circuit 421. In an alternate embodiment, the second op-amp 428 comprises the second open collector transistor 437 as a second op-amp output stage.

The second current control voltage, here gate control voltage "$V_{g2}$", is formed at the connection between the second and fourth voltage divider resistors 484 and 472, respectively. The connection between the second and fourth voltage divider resistors, 484 and 472 respectively, is also referred to as the second current control voltage node. Line 318 couples the gate control voltage $V_{g2}$ to gate 308 of the second power amplifier transistor 412.

The level shifting circuit 421 converts a gate control signal, preferably having a range of 0 V to 2 V, to a negative voltage, preferably having a range of –5 V to 0 V, at the collector 496 of second level shift transistor 494. The level shifted voltage appears at the collector 496 and is labeled $V_X$. For example, a low voltage close to 0 V applied at input 312 causes more current to flow through first level shift transistor 486. The larger current flowing through first level shift transistor 486 causes a voltage across level shift resistor 480 to increase, thereby increasing the voltage applied to base 495 of second level shift transistor 494. The increased voltage applied to base 495 causes the current flowing in second level shift transistor 494 to increase. The increased current of second level shift transistor 494 increases the voltage drop across resistors 474 and 482 and the voltage $V_X$ therefore decreases (becomes more negative). The voltages $V_{g1}$ and $V_{g2}$ are applied to the gates of the first and second power amplifier transistors, 406 and 412 respectively, thereby causing their currents and corresponding RF gain to drop. Note that a more negative gate control voltage applied to a depletion-type FET causes the current to decrease. Therefore, a lower gate control signal applied at input 312 corresponds to lower current in the first and second power amplifier transistors 406 and 412, respectively. Note that with the gate control signal applied at input 312 set to its minimum value of 0 V, voltage $V_X$ is close to the negative terminal voltage –VEE, which is the lowest voltage that $V_X$ can reach. This corresponds to the lowest voltages that can be developed for $V_{g1}$ and $V_{g2}$.

As the voltage of the gate control signal applied at input 312 is increased, less current flows through first level shift transistor 486. The lower current flow causes the voltage drop across level shift resistor 480 to decrease, thereby decreasing the voltage applied to base 495 of second level shift transistor 494. The decreased voltage applied to base 495 causes the current flowing in second level shift transistor 494 to decrease, which results in a decreased voltage drop across resistors 474 and 482. The voltage $V_X$ therefore increases, resulting in voltages $V_{g1}$ and $V_{g2}$ becoming less negative with respect to ground. The increased voltages $V_{g1}$ and $V_{g2}$ applied to the gates 404 and 308 of the first and second power amplifier transistors 406 and 412, respectively, causes their currents and corresponding RF gain to increase. Therefore, a higher gate control signal applied at input 312 corresponds to higher current in the first and second power amplifier transistors 406 and 412, respectively.

Drain current limiters 419 and 417 maintain a fixed current ratio between first and second power amplifier transistors 406 and 412, respectively, and compensate for differences in pinch-off voltages between the two stages. The fixed current ratio is accomplished by making the values of first and second current sampling resistors, 446 and 418 respectively, different values. If first current sampling resistor 446 is three times the resistance of second current sampling resistor 418, then the drain current of first power amplifier transistor 406 will be one third the drain current of second power amplifier transistor 412. This is because the feedback loop will maintain a substantially equal voltage drop across the two current sampling resistors. If a current sampling resistor has a greater resistance, less current needs to flow through that current sampling resistor in order for the voltage drop to substantially equal the voltage drop across other current sampling resistors.

For example, if the pinch-off voltage in the first power amplifier transistor 406 causes a higher than desired drain current to flow in first power amplifier transistor 406, the voltage drop across sampling resistor 446 would increase. The increased voltage drop would cause the voltage produced at the output 455 of first op-amp 460 to increase, thereby increasing the current through first open-collector transistor 462. The increased current through first open-collector transistor 462 causes an increased voltage drop across first and third voltage divider resistors, 499 and 470, respectively. The increased current will also cause an increased voltage drop across resistors 474 and 482, so voltage $V_X$ will drop slightly for both stages similarly. The voltage $V_{g1}$, however, will become more negative with respect to ground due to the increased voltage drop across first and third voltage divider resistors, 499 and 470, respectively. The decrease in voltage $V_{g1}$ will cause a correction (i.e. decrease in drain current) in the current of first power transistor 406 so that the desired current ratio between the first and second power transistors 406 and 412 are maintained.

If the pinch-off voltage in the first power amplifier transistor 406 caused a lower than desired drain current to flow in the first power amplifier transistor 406, then the voltage drop across current sampling resistor 446 would decrease. The decreased voltage drop would cause the voltage produced at op-amp output 455 to decrease, thereby decreasing the current through transistor 462. Voltage Vx will drop slightly for both stages, but the voltage $V_{g1}$ will become less negative with respect to ground due to the decreased voltage drop across first and third voltage divider resistors 499 and 470, respectively. The increase in voltage $V_{g1}$ will cause a correction in the drain current of first power transistor 406 so that the desired current ratio between the first and second power amplifier transistors 406 and 412 are maintained.

The second current limiter operates in conjunction with the second stage amplifier 304 in a similar fashion. In alternate embodiments, the multi-stage amplifier comprises more than two stages, and drain current limiting circuitry is attached to the additional stages to maintain fixed drain current ratios between the multiple stages.

Figure 5:
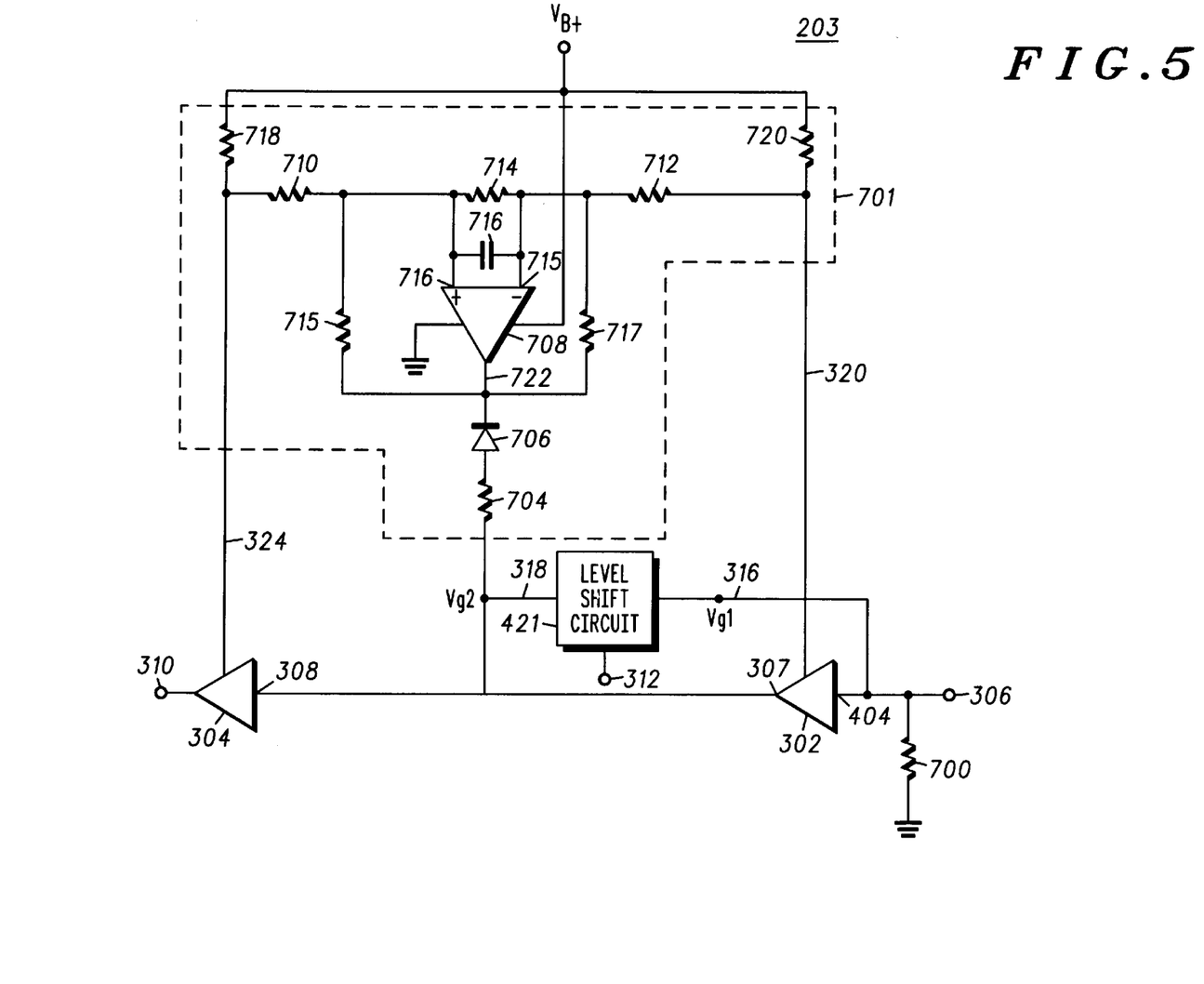
FIG. 5 is a partial circuit diagram partial block diagram of a an alternate embodiment of amplifying circuitry 203.

Turning now to FIG. 5, an alternate embodiment shows a circuit where the ratio between the drain currents of the first stage amplifier 302 comprising a first field effect transistor and the second stage amplifier 304 comprising a second field effect transistor are maintained by sampling the drain current in both stages but only including the second stage amplifier 304 in the loop feedback circuitry and utilizing a single drain current limiter 701.

In particular, the drain currents of the first and second stage amplifiers, 302 and 304 respectively, are sampled across current sampling resistors 720 and 718, respectively. The relative voltage drop across current sampling resistors 720 and 718 are coupled through isolation resistors 712 and 710, respectively, to the negative input 715 and the positive input 716 of drain limiter op-amp 708. Drain limiter op-amp 708 is a conventional op-amp comprising an open collector output stage. Resistors 714, 715, and 717 are used to maintain circuit balance as well as stability, and capacitor 716 provides differential RF bypassing. The op-amp output current appearing at output 722 of drain limiter op-amp 708 is coupled through diode 706 and current limiter voltage divider resistor 704 to line 318. Line 318 is coupled to level shifting circuit 421. The gate voltage for the second stage, $V_{g2}$, is developed on line 318 and coupled to input 308 of second stage amplifier 304. The gate voltage for the first stage, $V_{g1}$, is produced on line 316 and coupled to input 404 of first stage amplifier 302. A first gate bias resistor 700 couples input 404 of first stage amplifier 302 to ground. Diode 706 is for blocking leakage current, and thereby allowing current to flow in only one direction.

The operation of the alternate embodiment shown in FIG. 5 is similar to the operation of the embodiment described in FIG. 4 with the exception that in the alternate embodiment shown in FIG. 5 only the second stage's gate voltage is coupled through a feedback loop. The drain limiter op-amp 708 maintains the voltages at negative input 715 and positive input 716 substantially equal, thereby maintaining a certain ratio between drain currents when a certain ratio in the value of first and second current sampling resistors 720 and 718 are chosen. For example, if current sampling resistor 720 is three times larger than current sampling resistor 718, and the voltage drop across the resistors are maintained to be substantially equal, then the current flowing through first current sampling resistor 720 and first stage amplifier 302 will be one third the current flowing through second current sampling resistor 718 and second stage amplifier 304.

An increase in the gate control signal applied to the input 312 of level shifting circuit 421 will result in less negative with respect to ground voltages developed for voltages $V_{g1}$ and $V_{g2}$ and a subsequent increase in the drain current of the first and second stage amplifiers, 302 and 304, respectively. Variations in pinch off voltage between the two stages will thus be corrected for by maintaining the voltages at the drain limiter op-amp 708 inputs substantially equal.

Figure 6:
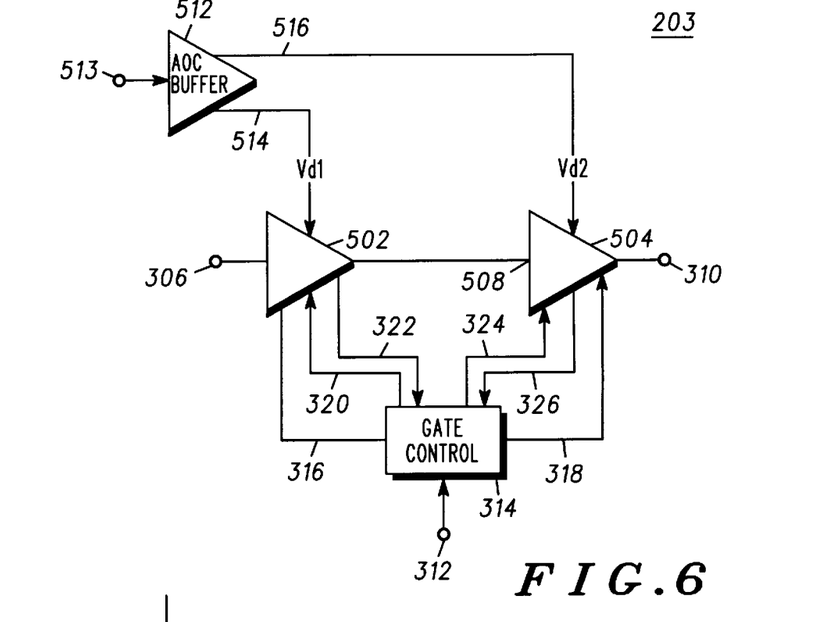
FIG. 6 is a block diagram of an alternate embodiment of amplifying circuitry 203 which employs both gate and drain voltage control.

Turning now to FIG. 6, a block diagram shows another alternate embodiment where both the drain and gate voltages are controlled. The addition of a drain voltage control circuit, here automatic output control (AOC) buffer 512, allows control of the drain voltages of each stage for even more gain control dynamic range. A power control signal is applied at input 513 of AOC buffer 512. A first output of AOC buffer 512 is coupled to first stage amplifier 502 through line 514 for varying a first drain voltage, and a second output of AOC buffer 512 is coupled to second stage amplifier 504 through line 516 for varying a second drain voltage, in response to the power control signal. The gate control circuitry is applied to the first and second stage amplifiers, 502 and 504 respectively, in a fashion similar to the connections described in the previous alternate embodiments.

Although the drain voltages could be applied directly to the amplifier from a control circuit such as a microprocessor, amplifying circuitry 203 also preferably includes AOC buffer 512. As will be described in more detail in the following figure, the two drain control voltages and the gate control voltages reduce current and maximize efficiency of the power amplifier.

Figure 7:
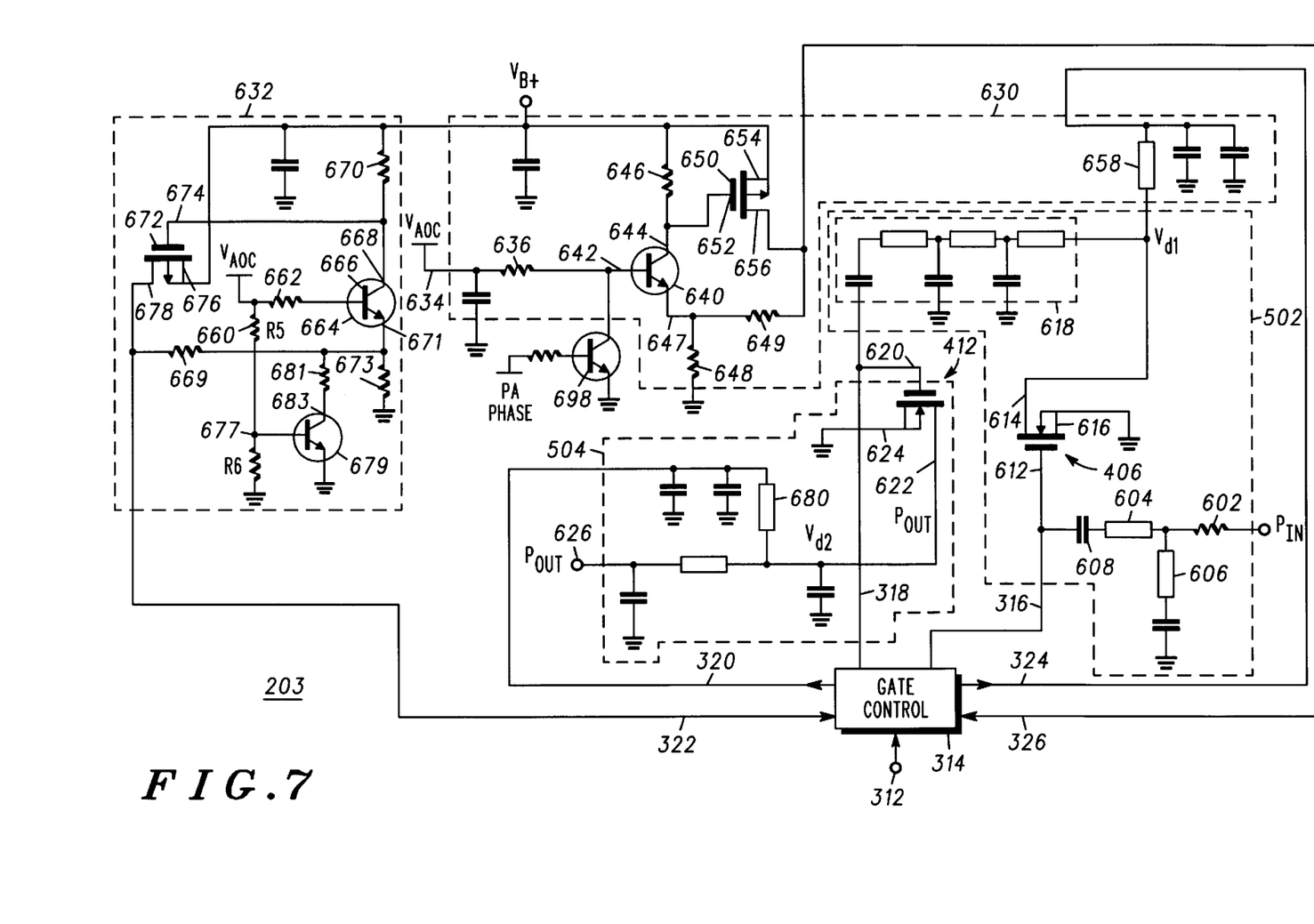
FIG. 7 is a more detailed circuit diagram of the alternate embodiment of amplifying circuitry 203 employing both gate and drain voltage control.

Turning now to FIG. 7, a circuit diagram of the alternate embodiment employing both gate and drain control is shown. In particular, the input power signal $P_{IN}$ is coupled to resistor 602 and a transmission line network comprising transmission lines 604 and 606. First and second stage amplifiers 502 and 504 preferably comprise N-channel depletion devices. However, other devices could be incorporated according to the present invention. The input signal is coupled to gate 612 of the first power amplifier transistor 406. The drain 614 of the first power amplifier transistor 406 is then coupled to the second power amplifier transistor 412 by a transmission circuit 618. The source and substrate 616 of first power amplifier transistor 406 are coupled to ground. The power signal is then coupled to a gate 620 of the second power amplifier transistor 412. The drain 622 of second power amplifier transistor 412 is coupled to an output 626 which provides the amplified power signal ($P_{out}$). The source and substrate 624 of second power amplifier transistor 412 are also coupled to ground.

AOC buffer 512 generally comprises a first AOC buffer 630 for generating $V_{d1}$ and a second AOC buffer 632 for generating $V_{d2}$. The voltage on the drain $V_{d1}$ of first power amplifier transistor 406 is generated to maximize the efficiency of the amplifier. First AOC buffer 630 receives a power control signal $V_{AOC}$ at an input 634 which is coupled by a resistor 636 to a control transistor 640 at a base 642. The power control signal $V_{AOC}$ is preferably a linear voltage signal (as $V_{AOC}$ increases, the output voltages at both drains will increase monotonically). The collector 644 is coupled to $V_{B+}$ by a resistor 646 while the emitter 647 is coupled both to ground through shunt resistor 648 and to a series resistor 649. The selection of values for the shunt resistor 648 and the series resistor 649 will contribute to the gain of the particular stage of the amplifier, and therefore the ratio of the gains of the first and second stage amplifiers, 302 and 304 respectively. The collector 644 of control transistor 640 (preferably a P-channel enhancement type MOSFET transistor) is also coupled to a transistor 650 at a gate 652. The source and substrate 654 are coupled to $V_{B+}$, while the drain 656 is coupled to gate control circuitry 314 by line 326. An output of gate control circuitry 314 is coupled on line 324 to a transmission line 458. Line 324 couples the current of first power amplifier transistor 406 to a current sampling resistor internal to gate control circuitry 314. The current is then coupled from the sampling resistor to the drain 614 of first power amplifier transistor 406 by line 324. Finally, an additional transistor 698 is coupled to the base of transistor 640 to shut off the first stage drain during bias phasing to eliminate oscillation in the second stage amplifier 412.

The second AOC buffer 632 also receives the power control signal $V_{AOC}$ at an input 634 which is coupled by a resistor 662 to a control transistor 664 at a base 666. The collector 668 is coupled to $V_{B+}$ by a resistor 670. The emitter 671 is coupled both to a series resistor 669 and to ground through a shunt resistor 673. The collector 668 is also coupled to a transistor 672 (preferably a P-channel enhancement type MOSFET transistor) at a gate 674. The source and substrate 676 of transistor 672 are coupled to $V_{B+}$. The drain 678 is coupled to gate control circuitry 314 by line 322, and an output of gate control circuitry 314 is coupled to a transmission line 680 by line 320. Line 322 couples the current of second power amplifier transistor 412 to a current sampling resistor internal to gate control circuitry 314. The current is then coupled from the sampling resistor to the drain 622 of second power amplifier transistor 412 by line 322. $V_{d2}$, which is generated at the output of transmission line 680, will also contribute to the efficiency of the second stage amplifier 304. Transistors 650 and 672 are preferably P-channel enhancement-type MOSFET transistors. However, other transistors could be used according to the present invention. A transistor 679 is also coupled to receive $V_{AOC}$ at its base by way of resistors 660 and 677. The collector 683 is coupled to a resistor 681, which is coupled in parallel to shunt resistor 673. When transistor 679 is biased on, resistor 681 is coupled in parallel with shunt resistor 673, changing the gain of the second stage.

Each control transistor is controlled by the following equation (1):

$$V_d = (V_{AOC} - V_{be}) * ((Rseries + Rshunt)/(Rshunt)), \text{ where}$$

$V_d$=Output voltage ($V_{d1}$ for the first stage, $V_{d2}$ for the second stage)

$V_{AOC}$=Input voltage (power control signal, preferably 0 to 2.75 Volts)

$V_{be}$=Base–emitter voltage

Gain=((Rseries+Rshunt)/Rshunt)

Rseries=Shunt feedback resistor (448 for first stage, 473 for second stage)

Figure 8:
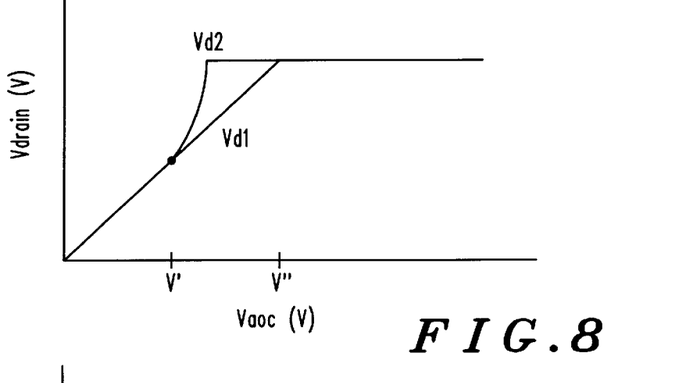
FIG. 8 is a plot showing the drain voltages of the two stage amplifier of FIG. 7 as a function of the power control signal according to the present invention.

A plot in FIG. 8 shows, as a function of the power control voltage $V_{AOC}$, voltages $V_{d1}$ at the drain 614 of first power amplifier transistor 406 and $V_{d2}$ at the drain 622 of second power amplifier transistor 412. $V_{d1}$ initially tracks $V_{d2}$ until $V_{AOC}$ reaches V'. Accordingly, during lower power levels, the circuit exhibits the efficiency of dual drain control. However, as $V_{AOC}$ increases above V', the base-emitter voltage of transistor 679 is exceeded, and transistor 679 is turned on and eventually placed in the saturation mode of operation. Resistor 681 is then placed in parallel with shunt resistor 673. As can be calculated from equation (1), the gain of the second stage will change, generating a fixed $V_{d2}$. As can be seen from FIG. 8, the circuit exhibits the efficiency of single drain control during high power levels. The series and shunt resistors are selected to generate predetermined gains at the two stages (and therefore a ratio $V_{d1}/V_{d2}$), depending upon a number of factors. V' is determined by the particular characteristics of the PA, such as the current consumption of a single drain control versus dual drain control having a 1:1 voltage ratio. V' is chosen at a point where single drain control becomes more efficient than dual drain control.

Figure 9:
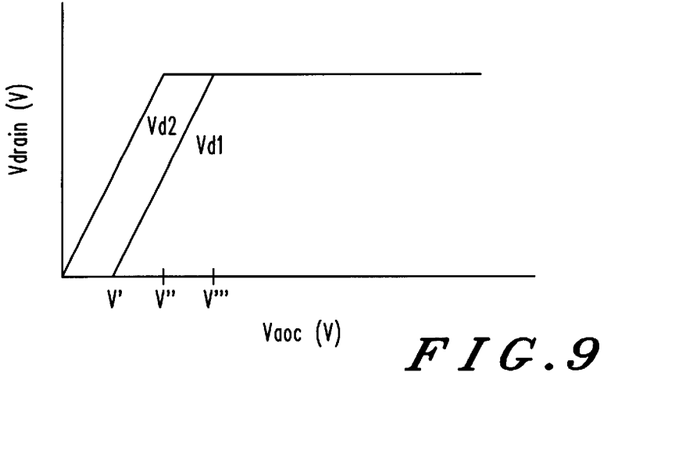
FIG. 9 is a plot showing the drain voltages of the two stage amplifier of FIG. 7 further employing a resistive voltage divider on the base circuitry of the AOC buffer for the first stage amplifier.

An alternate embodiment of the dual drain control has a resistor divider network at the base of control transistor 640. The resistor divider network delays the generation of $V_{d1}$ until the power control signal $V_{AOC}$ reaches a first voltage level V' as shown in FIG. 9. The circuit then exhibits dual drain control between V' and a second voltage level V", and single drain control between V" and a third voltage level V'".

Other circuits could be employed to vary the $V_{d1}$ and $V_{d2}$ curves as a function of $V_{AOC}$ as desired.

In summary, the apparatus set forth in the present disclosure describes dual gate control, and dual gate control in conjunction with dual drain control using a variable voltage supply on the gates and drains of the first and second stages to control the output power. Dual gate control provides accurate current ratioing between stages of a multi-stage amplifier when each stage has a different pinch-off voltage. The dual gate control results in a lower cost solution, since each power amplifier will not have to be calibrated at the factory for pinchoff voltage variation. The new apparatus and will also reduce cost by eliminating the need for redundant circuitry to develop separate gate control voltages to account for the different pinchoff voltages of each stage.

Dual drain control also provides the dynamic range necessary for the transmission of low power levels. While dual drain control having a 1:1 ratio (i.e. ratio of voltages applied to the drains) is efficient at low power levels, dual drain control having a 1:1 ratio is generally less efficient at high power levels than single drain control. Accordingly, dual drain control having a 1:1 ratio at lower power levels, with single drain control at higher power levels is preferably employed. Such dual drain control could be employed by directly varying the voltage on the drains of the power amplifier, such as signals from a microprocessor. Alternatively, specific circuits could be employed to generate the drain voltages based upon a control voltage. Such circuits using a control voltage would reduce the number of control signals from the microprocessor. For example, a circuit could emulate dual drain control up to a predetermined power level, with single drain control above that power level.

Although the invention has been described and illustrated in the above description and drawings, it is understood that this description is by way of example only and that numerous changes and modifications can be made by those skilled in the art without departing from the true spirit and scope of the invention. For example, the multi-stage amplifier may comprise more than two stages. Although the present invention finds particular application in portable cellular radiotelephones, the invention could be applied to any wireless communication device, including pagers, electronic organizers, or computers. Applicant's invention should be limited only by the following claims.

What is claimed is:

1. An apparatus for amplifying an RF signal comprising:
a first power amplifier transistor having a first transistor input for receiving an input RF signal and a first transistor output for producing an amplified RF signal, the first power amplifier transistor responsive to a first current control voltage coupled to the first amplifier input, the first current control voltage for adjusting a current present at the first transistor output;
a second power amplifier transistor having a second transistor input coupled to the first transistor output to receive the amplified RF signal, the second power amplifier transistor having a second transistor output for producing an output RF signal, the second power amplifier transistor responsive to a second current control voltage for adjusting a current present at the second transistor output;
a level shifting circuit coupled to the first transistor input and the second transistor input, the level shifting circuit for receiving a current control signal and shifting a voltage level of the current control signal to produce the first current control voltage and the second current control voltage;

a first current limiter to sample the current present at the first transistor output, the first current limiter coupled to the level shifting circuit to adjust the first current control voltage; and a second current limiter to sample the current present at the second transistor output, the second current limiter coupled to the level shifting circuit to adjust the second current control voltage.

2. The apparatus for amplifying an RF signal as in claim 1 wherein the first current control voltage and the second current control voltage substantially maintain the current present at the first transistor output and the current present at the second transistor output at a predetermined ratio with respect to each other.

3. The apparatus for amplifying an RF signal as in claim 2 further comprising an amplifier output voltage control circuit coupled to at least one of the first transistor output and the second transistor output, the amplifier output voltage control circuit for varying at least one of a first output voltage applied to the first transistor output and a second output voltage applied to the second transistor output, the amplifier output voltage control circuit varying at least one of the first output voltage and the second output voltage in response to a power control signal to change an output power produced at at least one of the first transistor output and the second transistor output.

4. The apparatus for amplifying an RF signal as in claim 2 wherein the level shifting circuit comprises:

a first level shift transistor coupled to receive the current control signal and generating a first level shift current;

a level shift resistor coupled to receive the first level shift current and producing an intermediate voltage; and a second level shift transistor responsive to the intermediate voltage and affecting the first and second current control voltages.

5. The apparatus for amplifying an RF signal as in claim 4 further comprising an amplifier output voltage control circuit coupled to at least one of the first transistor output and the second transistor output, the amplifier output voltage control circuit for varying at least one of a first output voltage applied to the first transistor output and a second output voltage applied to the second transistor output, the amplifier output voltage control circuit varying at least one of the first output voltage and the second output voltage in response to a power control signal to change an output power produced at at least one of the first transistor output and the second transistor output.

6. The apparatus for amplifying an RF signal as in claim 4 wherein the first current limiter comprises:

a first current sampling resistor for converting the current present at the first transistor output to a first sampling voltage;

a first op-amp responsive to the first sampling voltage and producing a first op-amp output voltage;

a first open collector transistor coupled to receive the first op-amp output voltage and producing a first collector current; and a first current limiter voltage divider resistor responsive to the first collector current for producing a voltage drop for affecting the first current control voltage.

7. The apparatus for amplifying an RF signal as in claim 6 wherein the first op-amp comprises the first open collector transistor as a first op-amp output stage.

8. The apparatus for amplifying an RF signal as in claim 6 wherein the second current limiter comprises:

a second current sampling resistor for converting the current present at the second transistor output to a second sampling voltage;

a second op-amp responsive to the second sampling voltage and producing a second op-amp output voltage;

a second open collector transistor coupled to receive the second op-amp output voltage and producing a second collector current; and a second current limiter voltage divider resistor responsive to the second collector current for producing a voltage drop for affecting the second current control voltage.

9. The apparatus for amplifying an RF signal as in claim 8 wherein the second op-amp comprises the second open collector transistor as a second op-amp output stage.

10. An apparatus for amplifying an RF signal comprising:

a first field effect transistor (FET) having a first FET gate for receiving an input RF signal and having a first FET drain for producing an amplified RF signal, the first FET gate to receive a first gate control voltage to control a current produced at the first FET drain;

a second FET having a second FET gate coupled to receive the amplified RF signal and having a second FET drain for producing an output RF signal, the second FET gate to receive a second gate control voltage to control a current produced at the second FET drain; and a drain current limiter to compare the current produced at the first FET drain to the current produced at the second FET drain, the drain current limiter coupled to the second FET gate for adjusting the second gate control voltage in response to comparing.

11. The apparatus for amplifying an PF signal as in claim 10 wherein the first gate control voltage and the second gate control voltage substantially maintain the current present at the first FET drain and the current present at the second FET drain at a predetermined ratio with respect to each other.

12. The apparatus for amplifying an RF signal as in claim 11 further comprising a drain voltage control circuit coupled to at least one of the first FET drain and the second FET drain for varying at least one of a first FET drain voltage applied to the first FET drain and a second FET drain voltage applied to the second FET drain in response to a power control signal.

13. The apparatus for amplifying an RF signal as in claim 11 wherein the drain current limiter comprises:

a first current sampling resistor for converting the current produced at the first FET drain to a first sampling voltage;

a second current sampling resistor for converting the current produced at the second FET drain to a second sampling voltage;

an op-amp responsive to the first and second sampling voltages to generate an op-amp output current at an op-amp output;

a diode coupled to the op-amp output for blocking a leakage current; and a current limiter voltage divider resistor coupled to the diode and responsive to the op-amp output current for producing a voltage drop for affecting the second gate control voltage.

14. The apparatus for amplifying an RF signal as in claim 13 wherein the op-amp comprises an open collector transistor as an op-amp output stage.

15. The apparatus for amplifying an RF signal as in claim 13 further comprising a drain voltage control circuit coupled to at least one of the first FET drain and the second FET drain for varying at least one of a first FET drain voltage applied to the first FET drain and a second FET drain voltage applied to the second FET drain in response to a power control signal.

16. An apparatus for amplifying an RF signal comprising:
a first field effect transistor (FET) having a first FET gate for receiving an input RF signal and having a first FET drain for generating an amplified RF signal, the first FET gate to receive a first gate control voltage to control a current produced at the first FET drain;
a second FET having a second FET gate coupled to receive the amplified RF signal and having a second FET drain for generating an output RF signal, the second FET gate to receive a second gate control voltage to control a current produced at the second FET drain; and
a drain current limiter to compare the current produced at the first FET drain to the current produced at the second FET drain, the drain current limiter coupled to the first FET gate for adjusting the first gate control voltage in response to comparing.

17. The apparatus for amplifying an RF signal as in claim 16 wherein the first gate control voltage and the second gate control voltage substantially maintain the current present at the first FET drain and the current present at the second FET drain at a predetermined ratio with respect to each other.

18. The apparatus for amplifying an RF signal as in claim 17 further comprising a drain voltage control circuit coupled to at least one of the first FET drain and the second FET drain for varying at least one of a first FET drain voltage applied to the first FET drain and a second FET drain voltage applied to the second FET drain in response to a power control signal.

19. The apparatus for amplifying an RF signal as in claim 17 wherein the drain current limiter comprises:
a first current sampling resistor for converting the current produced at the first FET drain to a first sampling voltage;
a second current sampling resistor for converting the current produced at the second FET drain to a second sampling voltage;
an op-amp responsive to the first and second sampling voltages to generate an op-amp output current at an op-amp output;
a diode coupled to the op-amp output for blocking a leakage current; and
a current limiter voltage divider resistor coupled to the diode and responsive to the op-amp output current for producing a voltage drop for affecting the first gate control voltage.

20. The apparatus for amplifying an RF signal as in claim 19 wherein the op-amp comprises an open collector transistor as an op-amp output stage.

21. The apparatus for amplifying an RF signal as in claim 19 further comprising further comprising a drain voltage control circuit coupled to at least one of the first FET drain and the second FET drain for varying at least one of a first FET drain voltage applied to the first FET drain and a second FET drain voltage applied to the second FET drain in response to a power control signal.

22. A radiotelephone comprising:
a receiver for receiving information and demodulating symbols comprising a message, the receiver using carrier frequencies;
a synthesizer for generating the carrier frequencies;
a transmitter for transmitting information using the carrier frequencies, the transmitter including:
a first power amplifier transistor having a first amplifier input for receiving an input RF signal and a first amplifier output for producing an amplified RF signal, the first power amplifier transistor responsive to a first control voltage coupled to the first amplifier input, the first control voltage for adjusting a current present at the first amplifier output;
a second power amplifier transistor having a second amplifier input coupled to receive the amplified RF signal and having a second amplifier output for producing an output RF signal, the second power amplifier transistor responsive to a second control voltage for adjusting a current present at the second amplifier output; and
output current control circuitry to sense an amount of current present at the first amplifier output and an amount of current present at the second amplifier output, the output current control circuitry connected to at least one of the first amplifier input and the second amplifier input, wherein the output current control circuitry adjusts at least one of a first control voltage applied to the first amplifier input and a second control voltage applied to the second amplifier input to maintain the current present at the first amplifier output and the current present at the second amplifier output at substantially a predetermined ratio with respect to each other.

23. The radiotelephone as in claim 22, wherein the transmitter further comprises a level shifting circuit coupled to the output current control circuitry, the first amplifier input, and the second amplifier input, the level shifting circuit for receiving a current control voltage and shifting a voltage level of the current control voltage to produce at least one of the first control voltage and the second control voltage.

24. An apparatus for amplifying an input signal comprising:
a first power amplifier transistor having a first amplifier input for receiving the input signal and a first amplifier output for producing an amplified signal, the first power amplifier transistor to receive a first bias voltage at the first amplifier input to affect a current present at the first amplifier output;
a second power amplifier transistor having a second amplifier input coupled to receive the amplified signal and having a second amplifier output for producing an output signal, the second power amplifier transistor to receive a second bias voltage at the second amplifier input to affect a current present at the second amplifier output; and
output current control circuitry coupled to the first and second amplifier outputs and at least one of the first and second amplifier inputs, the output current control circuitry responsive to the current present at the first amplifier output and the current present at the second amplifier output to affect at least one of the first bias voltage present at the first amplifier input and the second bias voltage present at the second amplifier input to maintain the current present at the first amplifier output and the second amplifier output at substantially a predetermined ratio with respect to each other.

25. The apparatus for amplifying an RF signal as in claim 24 wherein the output current control circuitry adjusts at least one of the first bias voltage and the second bias voltage to compensate for differences in semiconductor voltage potentials within the first power amplifier transistor and the second power amplifier transistor.

26. The apparatus for amplifying an RF signal as in claim 24 further comprising a level shifting circuit coupled to the output current control circuitry, the first amplifier input, and the second amplifier input, the level shifting circuit for receiving a current control voltage and altering a voltage level of the current control voltage to produce at least one of the bias voltage and the second bias voltage.

27. An apparatus for amplifying an input signal comprising:
- a first power amplifier transistor having a first amplifier input for receiving the input signal and a first amplifier output for producing an amplified signal, the first power amplifier transistor to receive a first bias voltage at the first amplifier input to affect a current present at the first amplifier output;
- a second power amplifier transistor having a second amplifier input coupled to receive the amplified signal and having a second amplifier output for producing an output signal, the second power amplifier transistor to receive a second bias voltage at the second amplifier input to affect a current present at the second amplifier output; and
- at least one operational amplifier coupled to the first and second amplifier outputs and coupled to at least one of the first and second amplifier inputs, the operational amplifier responsive to the current present at the first amplifier output and the current present at the second amplifier output to affect at least one of the first bias voltage present at the first amplifier input and the second bias voltage present at the second amplifier input to maintain the current present at the first amplifier output and the second amplifier output at substantially a predetermined ratio with respect to each other.

* * * * *

UNITED STATES PATENT AND TRADEMARK OFFICE
CERTIFICATE OF CORRECTION

PATENT NO. : 6,049,704
DATED : April 11, 2000
INVENTOR(S) : Peckham, David S. et al.

It is certified that error appears in the above-indentified patent and that said Letters Patent is hereby corrected as shown below:

Claim 11, line 31:

Please change "PF signal" to RF signal.

Signed and Sealed this

First Day of May, 2001

*Attest:*

NICHOLAS P. GODICI

*Attesting Officer*     *Acting Director of the United States Patent and Trademark Office*

UNITED STATES PATENT AND TRADEMARK OFFICE
CERTIFICATE OF CORRECTION

PATENT NO. : 6,049,704
DATED : April 11, 2000
INVENTOR(S) : Peckham, David S. et al.

It is certified that error appears in the above-identified patent and that said Letters Patent is hereby corrected as shown below:

Column 14,
Line 31, please change "PF signal" to -- RF signal --.

Signed and Sealed this

Fifth Day of October, 2004

JON W. DUDAS
*Director of the United States Patent and Trademark Office*